US 6,633,060 B2

(12) United States Patent
Zambrano

(10) Patent No.: US 6,633,060 B2
(45) Date of Patent: Oct. 14, 2003

(54) CONTACT STRUCTURE FOR A FERROELECTRIC MEMORY DEVICE

(75) Inventor: Raffaele Zambrano, Viagrande (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 09/998,602

(22) Filed: Nov. 16, 2001

(65) Prior Publication Data

US 2002/0070397 A1 Jun. 13, 2002

(30) Foreign Application Priority Data

Nov. 17, 2000 (EP) .......................................... 00830762

(51) Int. Cl.⁷ ........................................... H01L 31/062
(52) U.S. Cl. ...................... 257/295; 257/296; 257/306
(58) Field of Search ................. 257/295, 296, 257/306

(56) References Cited

U.S. PATENT DOCUMENTS

| | | | |
|---|---|---|---|
| 5,475,248 A | 12/1995 | Takenaka .................... 257/295 |
| 5,481,490 A | 1/1996 | Watanabe et al. ........... 365/145 |
| 5,578,867 A | 11/1996 | Argos, Jr. et al. .......... 257/632 |
| 5,638,319 A | 6/1997 | Onishi et al. ............... 365/145 |
| 5,716,875 A | 2/1998 | Jones, Jr. et al. ............... 438/3 |
| 5,717,236 A | * 2/1998 | Shinkawata .................. 257/306 |
| 5,750,419 A | 5/1998 | Zafar ............................. 438/3 |
| 5,811,847 A | 9/1998 | Joshi et al. .................. 257/296 |
| 5,864,153 A | 1/1999 | Nagel et al. ................. 257/296 |
| 5,956,594 A | 9/1999 | Yang et al. .................. 438/396 |
| 5,965,942 A | 10/1999 | Itoh et al. .................... 257/761 |
| 5,973,342 A | 10/1999 | Nakamura ................... 257/295 |
| 5,981,382 A | 11/1999 | Konecni et al. ............. 438/646 |
| 5,990,507 A | 11/1999 | Mochizuki et al. ......... 257/295 |
| 5,994,153 A | 11/1999 | Nagel et al. .................... 438/3 |
| 5,998,296 A | 12/1999 | Saran et al. ................. 438/685 |
| 6,037,252 A | 3/2000 | Hillman et al. ............. 438/637 |
| 6,043,529 A | 3/2000 | Hartner et al. .............. 257/306 |
| 6,043,561 A | * 3/2000 | Katori et al. ................ 257/295 |
| 6,051,858 A | 4/2000 | Uchida et al. ............... 257/295 |
| 6,075,264 A | 6/2000 | Koo ............................. 257/295 |
| 6,091,599 A | 7/2000 | Amamiya .................. 361/306.3 |
| 6,121,083 A | 9/2000 | Matsuki ....................... 438/254 |
| 6,180,974 B1 | 1/2001 | Okutoh et al. .............. 257/306 |
| 6,194,311 B1 | 2/2001 | Nakajima .................... 438/660 |
| 6,197,631 B1 | 3/2001 | Ishihara ....................... 438/240 |
| 6,239,460 B1 | 5/2001 | Kuroiwa et al. ............ 257/300 |
| 6,281,537 B1 | 8/2001 | Kim ............................. 257/295 |
| 6,313,539 B1 | 11/2001 | Yokoyama et al. ......... 257/761 |
| 6,485,988 B2 | * 11/2002 | Ma et al. ........................ 438/3 |
| 6,492,222 B1 | * 12/2002 | Xing ........................... 438/240 |

FOREIGN PATENT DOCUMENTS

| | | |
|---|---|---|
| DE | 19640246 A1 | 4/1998 |
| EP | 0793274 A1 | 9/1997 |
| EP | 0 837 504 A2 | 4/1998 |
| EP | 0 996 160 A1 | 6/2000 |
| WO | WO 98/05071 | 2/1998 |

OTHER PUBLICATIONS

Yamazaki, T. et al., "Advanced 0.5μm FRAM Device Technology with Full Compatibility of Half–Micron CMOS Logic device", IEEE, pp. 25.5.1–25.5.4, XP000855871, Dec. 1997.

* cited by examiner

Primary Examiner—Hoai Ho
Assistant Examiner—Tu-Tu Ho
(74) Attorney, Agent, or Firm—Lisa K. Jorgenson; Robert Iannucci; Seed IP Law Group PLLC

(57) ABSTRACT

A contact structure for a ferroelectric memory device integrated in a semiconductor substrate and includes an appropriate control circuitry and a matrix array of ferroelectric memory cells, wherein each cell includes a MOS device connected to a ferroelectric capacitor. The MOS device has first and second conduction terminals and is covered with an insulating layer. The ferroelectric capacitor has a lower plate formed on the insulating layer above the first conduction terminals and connected electrically to the first conduction terminals, which lower plate is covered with a layer of a ferroelectric material and coupled capacitively to an upper plate. Advantageously, the contact structure comprises a plurality of plugs filled with a non-conductive material between the first conduction terminals and the ferroelectric capacitor, and comprises a plurality of plugs filled with a conductive material and coupled to the second conduction terminals or the control circuitry.

17 Claims, 4 Drawing Sheets

CONTACT STRUCTURE FOR A FERROELECTRIC MEMORY DEVICE

BACKGROUND OF THE INVENTION

1. Field of the Invention

This invention relates to a contact structure for a ferroelectric memory device.

Specifically, the invention relates to a contact structure for a ferroelectric memory device integrated in a semiconductor substrate and comprising an appropriate control circuitry and a matrix array of ferroelectric memory cells, wherein each cell includes a MOS device connected to a ferroelectric capacitor; said MOS device having first and second conduction terminals and being covered with an insulating layer; and said ferroelectric capacitor having a lower plate formed on said insulating layer above said first conduction terminals and connected electrically to said terminals, said lower plate being covered with a layer of a ferroelectric material and coupled capacitively to an upper plate.

The invention relates, particularly but not exclusively, to a ferroelectric memory device of the stacked type, and the description which follows will refer to this field of application for convenience of illustration only.

2. Description of the Related Art

As it is well known, ferroelectric devices, such as ferroelectric non-volatile memories, are occupying a place of growing importance in the field of integrated circuits, thanks to their low power consumption as well as to their high write/erase speed with respect to traditional non-volatile memories.

Of special interest is, in particular, the possibility of manufacturing ferroelectric devices in combination with MOS devices integrated in a semiconductor substrate.

Semiconductor-integrated ferroelectric electronic non-volatile memory devices comprise a plurality of ferroelectric non-volatile memory cells arrayed as a matrix of rows (word lines) and columns (bit lines).

Each ferroelectric non-volatile memory cell comprises a MOS transistor and a ferroelectric capacitor.

Known manufacturing processes of such memory cells include an insulating layer which covers the whole chip surface, after the integration of a MOS transistor in a semiconductor substrate has been completed.

The ferroelectric capacitor is then formed over said insulating layer. This capacitor has conventionally a lower metal plate lying on the insulating layer.

The lower plate is covered with a layer of a ferroelectric material, or ferroelectric layer, and an upper metal plate lies on such ferroelectric layer.

Ferroelectric cells can be divided into two major classes according to their arrangement: the "strapped" or planar arrangement and the "stacked" one.

According to the strapped arrangement, the capacitor is formed outside the active area of the MOS transistor, and is connected to the latter by a metal interconnection extending between a conduction electrode of the MOS transistor and a plate of the ferroelectric capacitor.

FIG. 1A shows schematically a capacitor C1 of the strapped type, i.e., formed outside an active area, specifically outside the gate active area G1 of the MOS transistor. This capacitor C1 has a lower plate formed of a first layer BE1 deposited onto an insulating layer which completely covers the chip. A ferroelectric layer FE1 is formed on the first layer BE1. A second layer TE1, overlying the ferroelectric layer FE1, forms an upper plate of the capacitor C1.

In the second arrangement, shown in FIG. 1B, the ferroelectric capacitor is formed at the active area of the MOS transistor and is connected to the latter by a buried contact or plug connecting a conduction electrode of the MOS transistor to the lower plate of the ferroelectric capacitor.

FIG. 1B shows schematically a capacitor C2 of the stacked type, i.e., formed at an active area, specifically at the gate active area G2 of the transistor. As for the strapped capacitor C1, the stacked capacitor C2 comprises a first layer or lower plate BE2, a ferroelectric layer FE2, and a second layer or upper plate TE2, which layers are formed above a buried plug connecting the gate active area G2 to the lower plate BE2 of the capacitor C2.

The stacked arrangement can better meet the requirements for integration with advanced CMOS technologies, although the size of the ferroelectric capacitor is critical to the optimization of the cell area.

An article "Advanced 0.5 $\mu$m FRAM Device Technology with Full Compatibility of Half-Micron CMOS Logic Device" to Yamazachi et al. provides a first known way for forming ferroelectric devices and their contacts.

In particular, the above article describes contacts or plugs, for electrical connection of ferroelectric devices to MOS structures, by means of contact regions of the MOS device, these contact regions being obtained by filling openings, provided in the insulating layer portion that overlies the control terminal, with a conductive material, such as tungsten (W-plug).

This W-plugs technique does allow plugs to be defined which have a high aspect ratio, i.e., a high ratio of depth to width of the plug, but is inconvenient to use where such W-plugs are to undergo thermal treatments under an oxidizing environment during following process steps.

Unfortunately, this is the case of ferroelectric devices. Most ferroelectric materials are treated at temperatures in the 500° to 850° C. range under oxygen after patterning.

In such a case, the tungsten-filled plugs must be sealed with barrier layers of non standard materials for integrated circuits manufacturing processes, in order to avoid release of volatile matter, such as $W_2O_5$, from the tungsten in the temperature range of 500° to 800° C. It should be noted that the considered specific temperature range is the same as that provided in annealing and crystallizing processes to finish ferroelectric devices.

In fact, tungsten (W) reacts with oxygen ($O_2$) to yield tungsten pentoxide ($W_2O_5$), which is a non-conductive material, according to a highly exothermic process likely to leave a contaminated oxidation oven.

Similarly, polysilicon (polySi) reacts with oxygen ($O_2$) to yield silicon dioxide ($SiO_2$), which is a non-conductive material, according to a process which causes greatly expanded volumes and, therefore, a high stress in the structure.

Also known is to use materials impermeable to oxygen ($O_2$), such as Ir or $IrO_2$. However, this considerably complicates the process of manufacturing a device that includes such materials.

Similar considerations apply to the filling of the contact regions with polysilicon (polySi-plug), which oxidizes and becomes insulative when subjected to the thermal treatments required for crystallization of ferroelectric materials.

However, the additional steps required to provide such non standard barrier layers greatly complicate the manufacturing process.

Furthermore, the ferroelectric device described in the above referred document has an interconnection formed between the MOS device and the ferroelectric device which is realized by means of a layer of titanium nitride (TiN)—referred to as a local interconnection.

From U.S. patent application Ser. No. 09/365,187, assigned to STMicroelectronics S.r.l. and incorporated herein by reference, it is known to provide a contact structure for a ferroelectric device by using a coating with a barrier of a conductive material which has been deposited ahead of plug-forming and filled with an insulating material, such a conductive coating being used to establish an electrical connection between the lower and upper portions of the plug itself.

According to the above Application, the contact structure is filled with oxide, rather than a conductive material like tungsten (W) or polysilicon (polySi). This eliminates the problems connected with the process of annealing under an oxidizing environment which follows depositing the ferroelectric material.

FIG. 2 shows a schematic cross-sectional view of a portion 1 of a memory matrix of the parallel type comprising a plurality of ferroelectric non-volatile memory cells 2.

Each memory cell 2 comprises a MOS transistor 3 and a ferroelectric capacitor 4, in series with each other.

The cells 2 of the memory matrix 1 are conventionally arrayed as rows WL (word lines) and columns BL (bit lines), each cell 2 being univocally identifiable at an intersection of bit lines and word lines.

Referring to FIG. 2, a set of MOS transistors 3 is formed on a semiconductor substrate 5. As it is well known to the skilled persons in the art, each MOS transistor 3 has source and drain doped regions 6 in which conduction terminals of the transistor 3 are respectively formed.

In addition, a control gate electrode 7 of polysilicon overlies a region of said substrate 5 which extends between the source and drain regions 6, and is isolated from the surface of the substrate 5 by a thin oxide layer 8. According to this serial arrangement, adjacent transistors 3 in the same column BL have a conduction terminal in common.

An insulating layer 9, e.g., a boron/phosphorus-doped oxide (BPSG) is then formed over the whole chip surface. Openings are made through this insulating layer 9 at the locations of the source and drain regions 6, conventionally to provide respective plugs 10 which form the source and drain terminals of the transistor 3.

The memory matrix 1 further includes ferroelectric capacitors 4 formed at each MOS transistor 3.

Each ferroelectric capacitor 4 has a lower metal plate 11, e.g., of platinum, which lies on the insulating layer 9 at first conduction terminals 6A and overlies, at least in part, the control electrode 7 of the transistor 3.

A layer 12 of ferroelectric material covers the lower plate 11 and overlies the chip surface completely. After depositing this ferroelectric material layer 12, openings are made above the second conduction terminals 6B. In particular, islands 11A of conductive material are defined at the second terminals 6B.

A metal upper plate 13, which may also be, for example, of platinum, is placed on the ferroelectric material layer 12 and defined to partly overlap two lower plates 11 of adjacent cells 2.

Thus, a plurality of ferroelectric memory cells 2 are provided, each comprising a MOS transistor 3 and a ferroelectric capacitor 4 in series with each other.

The memory matrix 1 is then finished conventionally by depositing an insulating layer 14, a first metalization layer (Metal1) forming the bit line BL, a further insulating layer, and a second metalization layer (Metal2) forming the word line WL.

In this known solution, the conduction area is limited to a thin barrier layer, which may result in the contact resistance being increased to a significant extent. In particular, with an aspect ratio of more than 5, contact resistance may be about 100 Ω.

Although the increased resistance would leave the operation of the ferroelectric memory cell 2 unaffected, it may significantly affect the performance of the memory control circuitry.

BRIEF SUMMARY OF THE INVENTION

An embodiment of this invention provides a contact structure for a ferroelectric device with such structural and functional features as to overcome the limitations and drawbacks which have beset prior ferroelectric devices, particularly on account of their contact structures.

An embodiment of this invention is that of using two different types of contacts or plugs, namely a first type filled with a non-conductive material, such as a silicon oxide, and a second type filled with a conductive material, such as tungsten (W) or polysilicon (polySi).

The contact structure includes a first plurality of plugs filled with a nonconductive material coupled between first conduction terminals and a ferroelectric capacitor, and a second plurality of plugs filled with a conductive material for a second conduction terminals or control circuitry.

Another embodiment of the present invention is ferroelectric non-volatile memory cell that includes contact regions of a second conduction terminal filled with a conductive material, and as well as by a ferroelectric memory device as previously indicated and defined by a first plurality of plugs filled with a non-conductive material coupled between first conduction terminals and a ferroelectric capacitor, and a plurality of plugs filled with a conductive material for second conduction terminals or control circuitry.

The features and advantages of a contact structure, cell, and ferroelectric memory device according to this invention will be apparent from the following description of embodiments thereof, given by way of non-limitative examples with reference to the accompanying drawings.

BRIEF DESCRIPTION OF THE SEVERAL VIEWS OF THE DRAWING(S)

DETAILED DESCRIPTION OF THE INVENTION

A portion of a ferroelectric memory matrix including a contact structure according to this invention will now be described with reference to the drawings, in particular to FIG. 3 thereof.

Figure 1A:
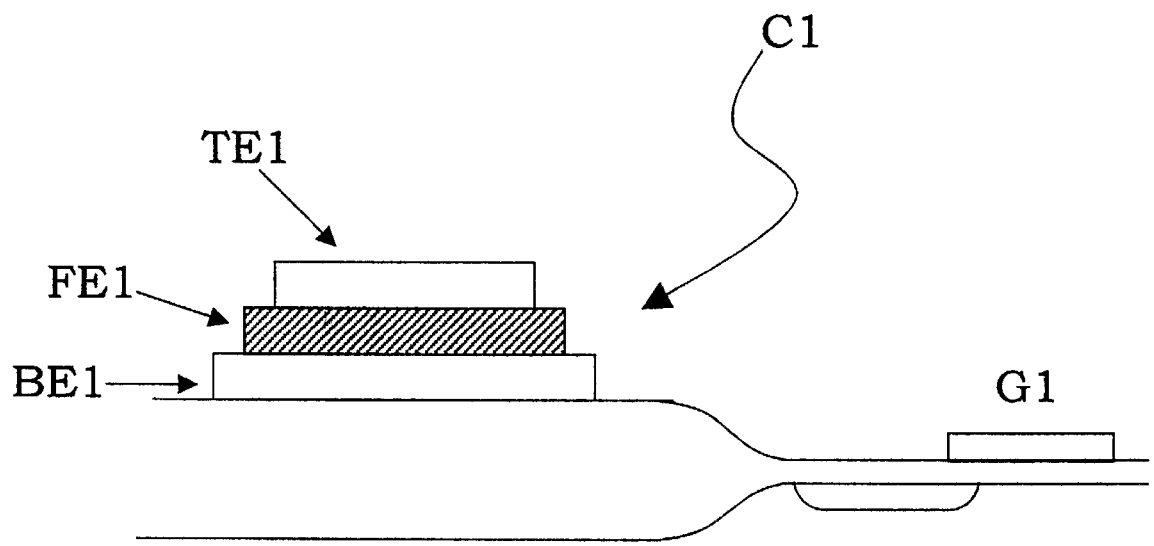
FIGS. 1A and 1B show schematic cross-sectional views of exemplary integrations of ferroelectric capacitors to memory devices, according to the prior art.
Figure 1B:
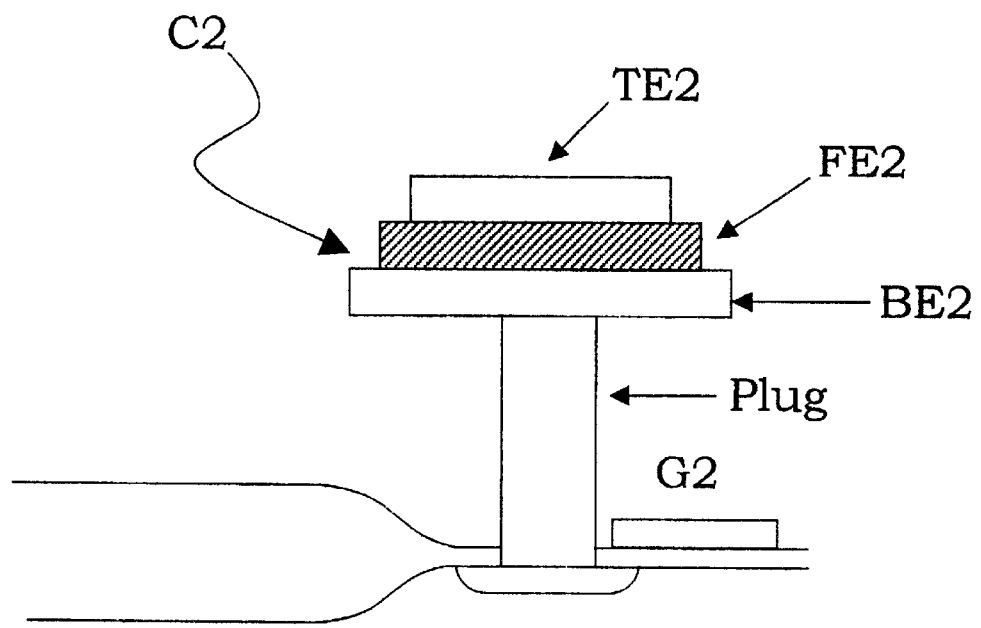
Figure 2:
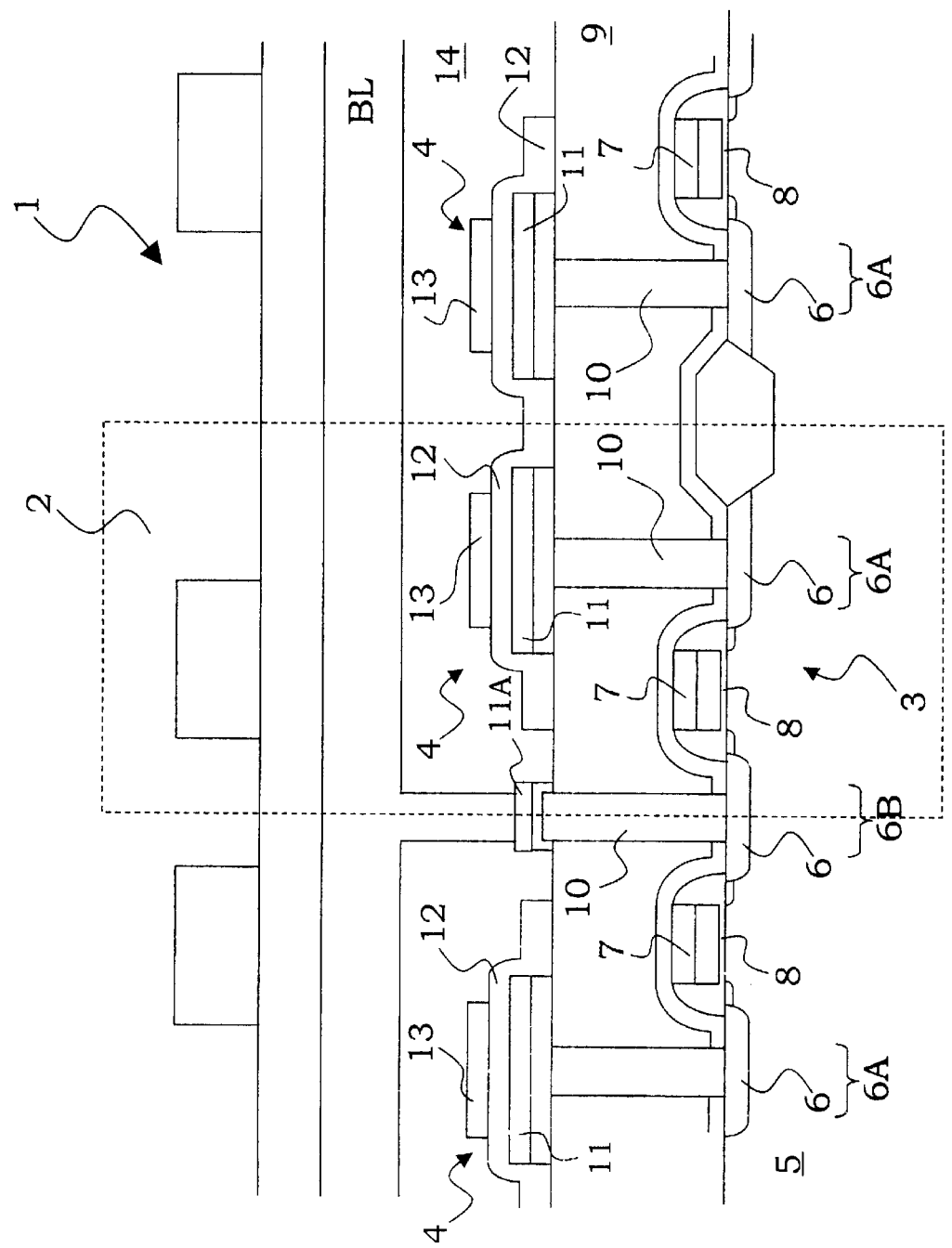
FIG. 2 shows a schematic cross-sectional view of a portion of a semiconductor substrate in which a plurality of ferroelectric memory cells of the parallel type have been integrated, according to the prior art.

For convenience of illustration, the same references are used throughout to denote elements which are functionally and constructionally identical with those of the prior device described in the preamble and shown in FIG. 2.

Figure 3:
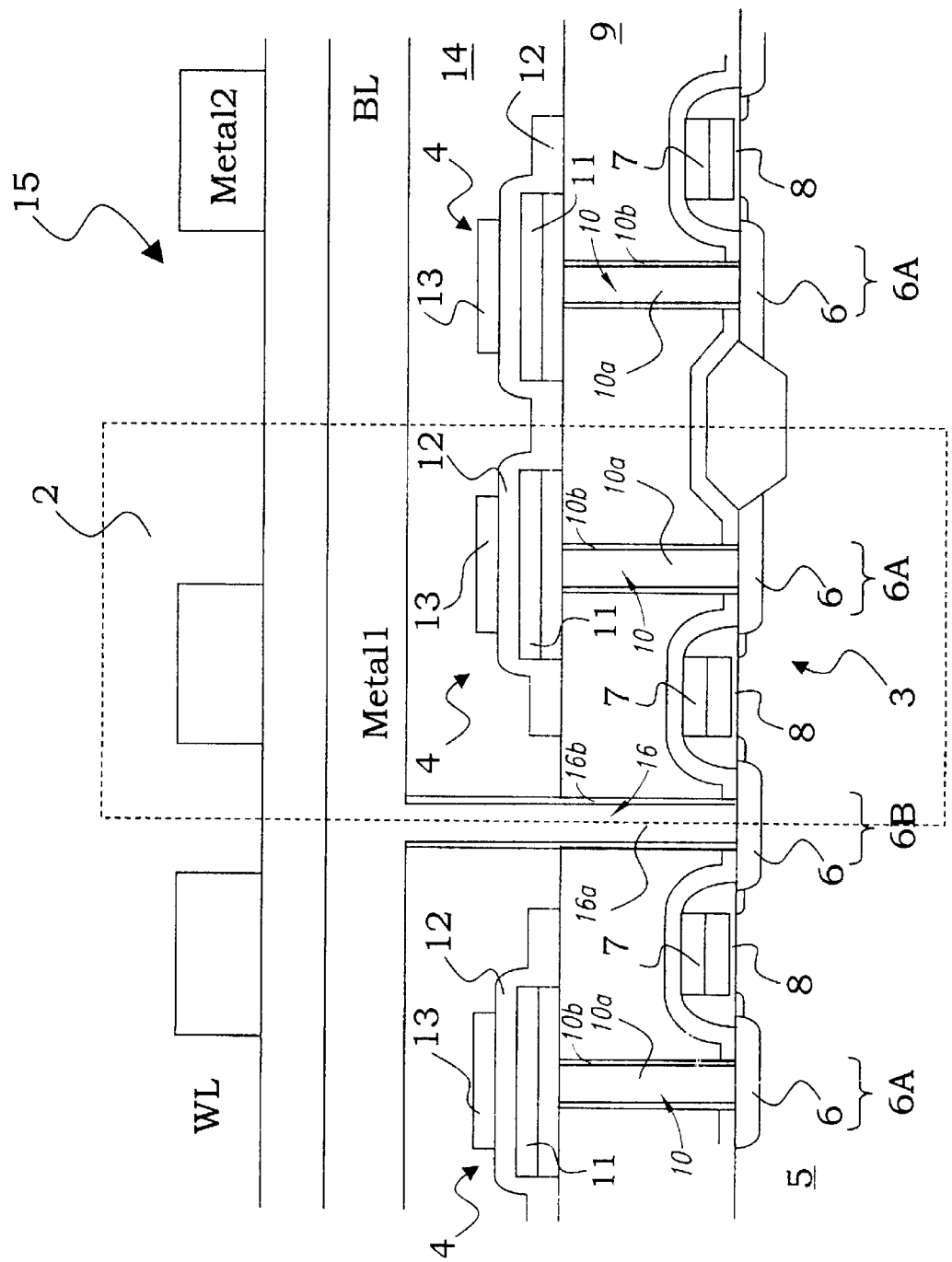
FIG. 3 shows a schematic cross-sectional view of a portion of a semiconductor substrate in which a plurality of ferroelectric memory cells of the parallel type have been integrated and connected by means of the contact structure according to this invention.

In particular, FIG. 3 shows a portion 15 of a serial memory matrix which comprises a plurality of ferroelectric non-volatile memory cells 2.

As previously mentioned in relation to the prior art, each memory cell 2 comprises at least one MOS transistor 3 and a ferroelectric capacitor 4, connected in series with each other.

In particular, a set of MOS transistors 3 is formed on a semiconductor substrate 5. As it is known to the skilled persons in the art, each MOS transistor 3 has source and drain doped regions 6 where respective conduction terminals of the transistor 3 are formed.

In addition, a control gate electrode 7 of polysilicon overlies a region of the substrate 5 which is between the source and drain regions 6 and is isolated from the surface of the substrate 5 by a thin oxide layer 8. In this arrangement, adjacent transistors 3 in the same column BL will have a conduction terminal in common.

An insulating layer 9, e.g., an oxide doped with boron and phosphorus (BPSG), is then formed over the whole chip surface. Openings are made through this insulating layer 9 at the locations of the source and drain regions 6, conventionally to provide respective contacts or plugs 10 being first conduction terminals 6A of the transistor 3.

The memory matrix 14 further includes ferroelectric capacitors 4 formed at each MOS transistor 3.

Each ferroelectric capacitor 4 has a lower metal plate 11, e.g., of platinum, which lies on the insulating layer 9 at the first conduction terminals 6A and overlaps, at least partially, the control electrode 7 of the transistor 3.

A layer 12 of ferroelectric material covers the lower plate 11 and overlies the whole surface of the chip.

A metal upper plate 13, which may also be platinum, for example, is placed on the ferroelectric material layer 12 and defined to partly overlap two lower plates 11 from adjacent cells 2.

Advantageously, after the ferroelectric capacitor 4 is completely defined, appropriate openings are defined above the second conduction terminals 6B, and appropriate contacts or plugs 16 are provided using a metal material.

In particular, these metal plugs can be formed by means of tungsten (W) using conventional technologies.

As previously mentioned in relation to the prior art, the plugs 10 consist of oxide plugs 10A coated with a barrier 10B of conductive titanium/titanium nitride layers to guarantee electrical connection between the silicon substrate (plug bottom) and the upper metalization layers (plug top portion).

The plugs 16 have likewise a coating barrier 16B, but filled with a metal material 16A, such as tungsten (W).

The process for making such plugs basically comprises the steps of:

making appropriate openings at the locations of the conduction terminals of interest, 6A or 6B, and the corresponding active areas;

forming or depositing a conductive material layer over the exposed areas, in particular coating the sidewall surfaces, bottoms and upper edges of said openings; and filling the coated openings with either a non-metal (silicon oxide) or a metal (tungsten) material.

The plugs are conventionally finished by a planarizing process, such as by anisotropically etching back the contact outer oxide layer with plasma, or carrying out a CMP (Chemical Mechanical Polishing) step.

For the conductive material layer, or barrier layer, either titanium, or titanium nitride, or a composite material comprising a layer of titanium and one of titanium nitride, may be used.

The plug filling step may comprise depositing tetraethylorthosilane (TEOS) by plasma-enhanced CVD (PECVD), for example.

Alternatively, undoped oxide (USG) or boron/phosphorus-doped oxide (BPSG) may be used.

The memory matrix portion 15 of this invention will, therefore, include a contact structure which comprises a plurality of plugs 10 filled with a non-metal material, such as silicon oxide, and a plurality of plugs 16 filled with a metal material, e.g., with tungsten (W).

Referring in particular to FIG. 3, the oxide-filled plugs 10 are used for connecting the lower plate 11 of the capacitor 4 to the source region of the transistor 3, and the tungsten-filled plugs 16 are used for contacting the drain region of the transistor 3.

A plurality of ferroelectric memory cells 2, each having a series of a MOS transistor 3 and a ferroelectric capacitor 4, are thus provided.

The memory matrix is then completed by conventional depositions of an insulating layer 14, a first metalization layer (Metal1) forming the bit line BL, a further insulating layer, and a second metalization layer (Metal2) forming the word line WL.

Figure 4:
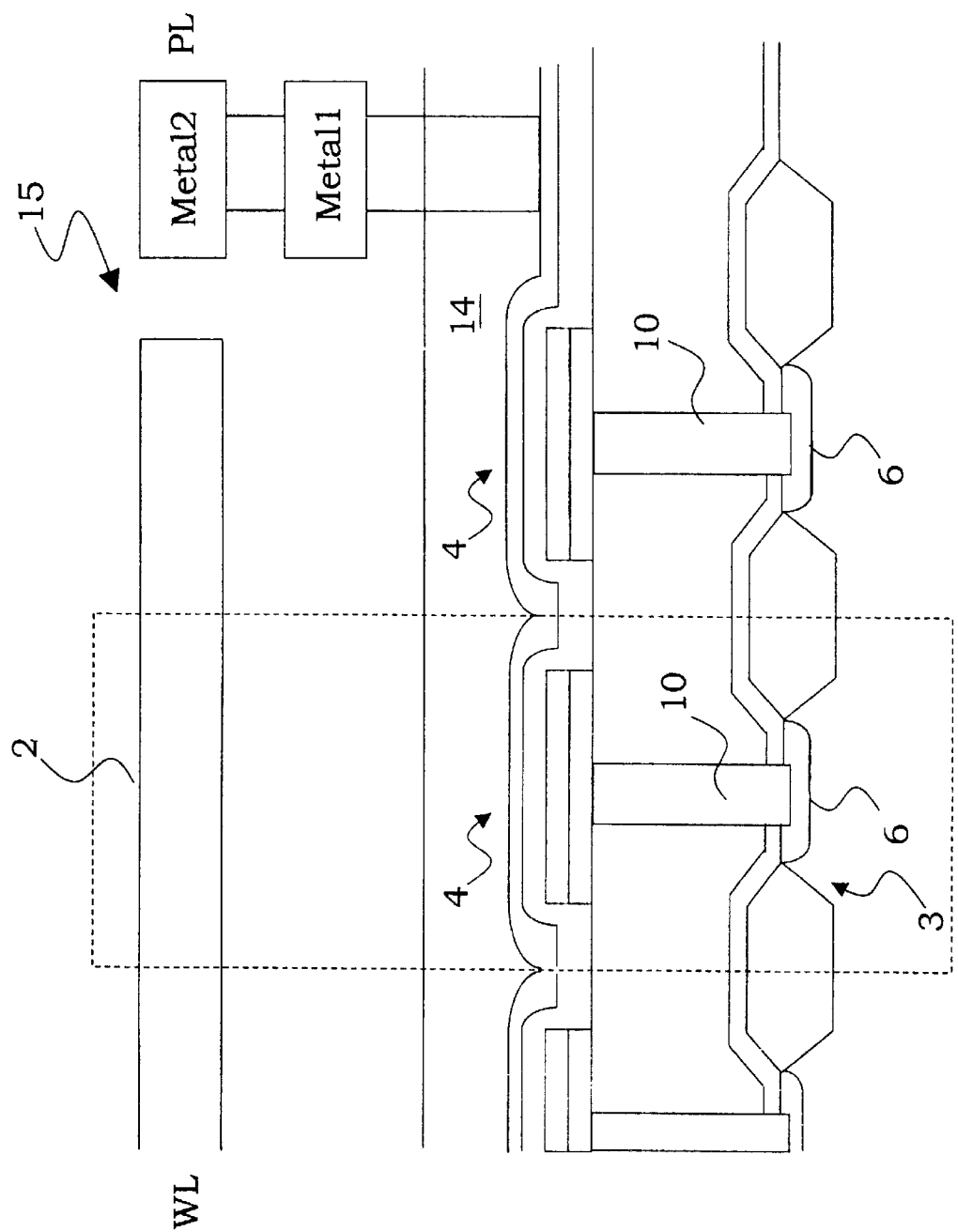
FIG. 4 shows a schematic longitudinal cross-section view of the semiconductor substrate portion shown in FIG. 3.

FIG. 4 shows in cross-section the memory matrix portion 15, according to the invention, and in particular forming the word line WL by means of the second metalization layer (Metal2).

The embodiment adopted for the contact structure of this invention trades a slightly more complicated alignment of two processing masks, which masks are necessary to form different plugs on the same transistor, in favor of the contact resistance.

In a possible alternative embodiment of the inventive contact structure, metal material is only used for the memory matrix control circuitry, the plugs being filled with oxide in both the source and the drain regions.

Thus, the above alternative embodiment provides a sharp differentiation of contact regions, in the matrix and the circuitry.

In this way, the problems connected with aligning the required masks in order to form the matrix transistors are obviated, at the expense of a slightly increased overall serial resistance for the structure.

It should be considered, however, that this increase in the contact resistance of the memory matrix bears virtually no influence on the performance of the ferroelectric memory.

To summarize, the contact structure has the following advantages: The tungsten plugs are only formed (in either embodiments) after the ferroelectric capacitor 3 is fully defined; specifically the tungsten plugs formation follows completion of all the process steps which are carried out under an oxidizing medium. The second metalization line, (Metal2), also indicated as the plate line PL, is contacted by tungsten plugs the same way as in conventional memory devices. It is no longer necessary to define islands of a conductive material in order to form the contacts or plugs for the bit line BL, and no processing steps need to be added to the standard steps of a ferroelectric memory manufacturing process.

The foregoing description refers to a memory matrix of the parallel type, i.e., a matrix in which the MOS transistors are in series with the ferroelectric capacitor 4. However, the possibility of applying the invention to memory matrices of the serial type, i.e., matrices in which the MOS transistors are in parallel with the ferroelectric capacitor 4, is self-evident.

Furthermore, the plugs 16 could be filled with polysilicon (polySi) rather than tungsten (W).

I claim:

1. A contact structure for a ferroelectric memory device integrated in a semiconductor substrate and including an appropriate control circuitry and a matrix array of ferroelectric memory cells, wherein each cell includes a MOS device connected to a ferroelectric capacitor; said MOS device having first and second conduction terminals and being covered with an insulating layer; and said ferroelectric capacitor having a lower plate formed on said insulating layer above said first conduction terminal and coupled to said first conduction terminal, and said lower plate being covered with a layer of a ferroelectric material and coupled capacitively to an upper plate, the contact structure comprising:
   a first plurality of plugs filled with a non-conductive material coupled to said first conduction terminals and said ferroelectric capacitor; and
   a second plurality of plugs filled with a conductive material and coupled to said second conduction terminal or said control circuitry.

2. A contact structure according to claim 1, wherein said conductive material filled plugs form said second conduction terminals of said MOS devices of said ferroelectric memory cells.

3. A contact structure according to claim 1, wherein said conductive material filled plugs are connected to said control circuitry.

4. A contact structure according to claim 1, wherein said conductive material comprises tungsten.

5. A contact structure according to claim 1, wherein said conductive material comprises polysilicon (polySi).

6. A contact structure according to claim 1, wherein said plurality of conductive material filled plugs are formed after completing said ferroelectric capacitor.

7. A ferroelectric memory device, comprising:
   a matrix array of ferroelectric memory cells integrated in a semiconductor substrate and arrayed as a plurality of rows and columns, wherein each cell includes a MOS device and a ferroelectric capacitor connected to each other;
   said MOS device having first and second conduction terminals and being covered with an insulating layer;
   said ferroelectric capacitor having a lower plate formed on said insulating layer above said first conduction terminals and connected electrically to said terminals, said lower plate being covered with a layer of a ferroelectric material and coupled capacitively to an upper plate; and
   a first plurality of plugs filled with a non-conductive material and positioned between said first conduction terminals and said ferroelectric capacitor, and a second plurality of plugs filled with a conductive material and coupled to said second conduction terminals or said control circuitry.

8. A ferroelectric memory device according to claim 7, wherein said conductive material filled plugs form said second conduction terminals of said MOS devices of said ferroelectric memory cells.

9. A ferroelectric memory device according to claim 7, wherein said conductive material filled plugs are connected to said control circuitry.

10. A ferroelectric memory device according to claim 7, wherein said conductive material comprises tungsten.

11. A ferroelectric memory device according to claim 7, wherein said conductive material comprises polysilicon (polySi).

12. A ferroelectric memory device according to claim 7, wherein said plurality of conductive material filled plugs are formed after completing said ferroelectric capacitor.

13. A ferroelectric memory cell comprising:
   a MOS transistor having first and second terminals;
   a first contact region formed in a first contact opening having an interior surface, the first contact region including a barrier layer of conductive material coating the interior surface of the first contact opening and contacting the first terminal, the first contact opening being filled with a non-conductive plug; and
   a second contact region formed in a second contact opening having an interior surface, the second contact region including a barrier layer of conductive material coating the interior surface of the second contact opening and contacting the second terminal, the second contact opening being filled with a conductive plug;
   a ferroelectric capacitor having first and second plates wherein the first plate is electrically connected to one of the first and second contact regions and the second plate is capacitively coupled to the first plate.

14. A ferroelectric memory cell according to claim 13 wherein the first plate is connected to the first contact region and the second contact region is connected to a bit line that extends above the ferroelectric capacitor.

15. A ferroelectric memory cell according to claim 14 wherein the barrier material for the first and second contact regions includes titanium.

16. A ferroelectric memory cell according to claim 14 wherein the nonconductive plug includes silicon oxide.

17. A ferroelectric memory cell according to claim 14 wherein the conductive plug includes tungsten.

* * * * *